United States Patent
Swantner et al.

(10) Patent No.: US 7,598,534 B2
(45) Date of Patent: Oct. 6, 2009

(54) LED LIGHT SOURCE WITH INTEGRATED CIRCUIT AND LIGHT GUIDE

(75) Inventors: Michael J. Swantner, Saxonburg, PA (US); Douglas G. Seymour, York, PA (US)

(73) Assignee: Osram Sylvania Inc., Danvers, MA (US)

( * ) Notice: Subject to any disclaimer, the term of this patent is extended or adjusted under 35 U.S.C. 154(b) by 513 days.

(21) Appl. No.: 11/507,319

(22) Filed: Aug. 21, 2006

(65) Prior Publication Data

US 2008/0042147 A1  Feb. 21, 2008

(51) Int. Cl.
    *H01L 23/12* (2006.01)
(52) U.S. Cl. .......................... 257/98; 257/99; 257/684; 257/731; 257/E31.127
(58) Field of Classification Search .................... 257/79, 257/98, 99, 100, 684, 727, 731, E31.127
    See application file for complete search history.

(56) References Cited

U.S. PATENT DOCUMENTS

| | | | |
|---|---|---|---|
| 6,481,130 B1 * | 11/2002 | Wu | 40/546 |
| 6,502,956 B1 * | 1/2003 | Wu | 362/237 |
| 2003/0193055 A1 * | 10/2003 | Martter et al. | 257/79 |

* cited by examiner

*Primary Examiner*—Evan Pert
*Assistant Examiner*—Scott R Wilson
(74) *Attorney, Agent, or Firm*—William H. McNeill

(57) ABSTRACT

An elongated light source (50) comprises a subassembly (51) including a base (54), a light engine (10) positioned in mounting means (56) formed with the base; a light guide (58) positioned in spaced apart supports (57), and a cover (62) fixed to the base (54). The light engine (10) comprises a thermally conductive substrate (12) having a dielectric (14) on one side thereof; upper and lower lens guards, (16, 18), respectively, positioned near one end (20) of the substrate (12); at least one LED (22) mounted on the substrate between the lens guards (16, 18); and electrical conductors (24, 26) mounted upon the substrate at another end (28) thereof for supplying power to the LED (22).

9 Claims, 2 Drawing Sheets

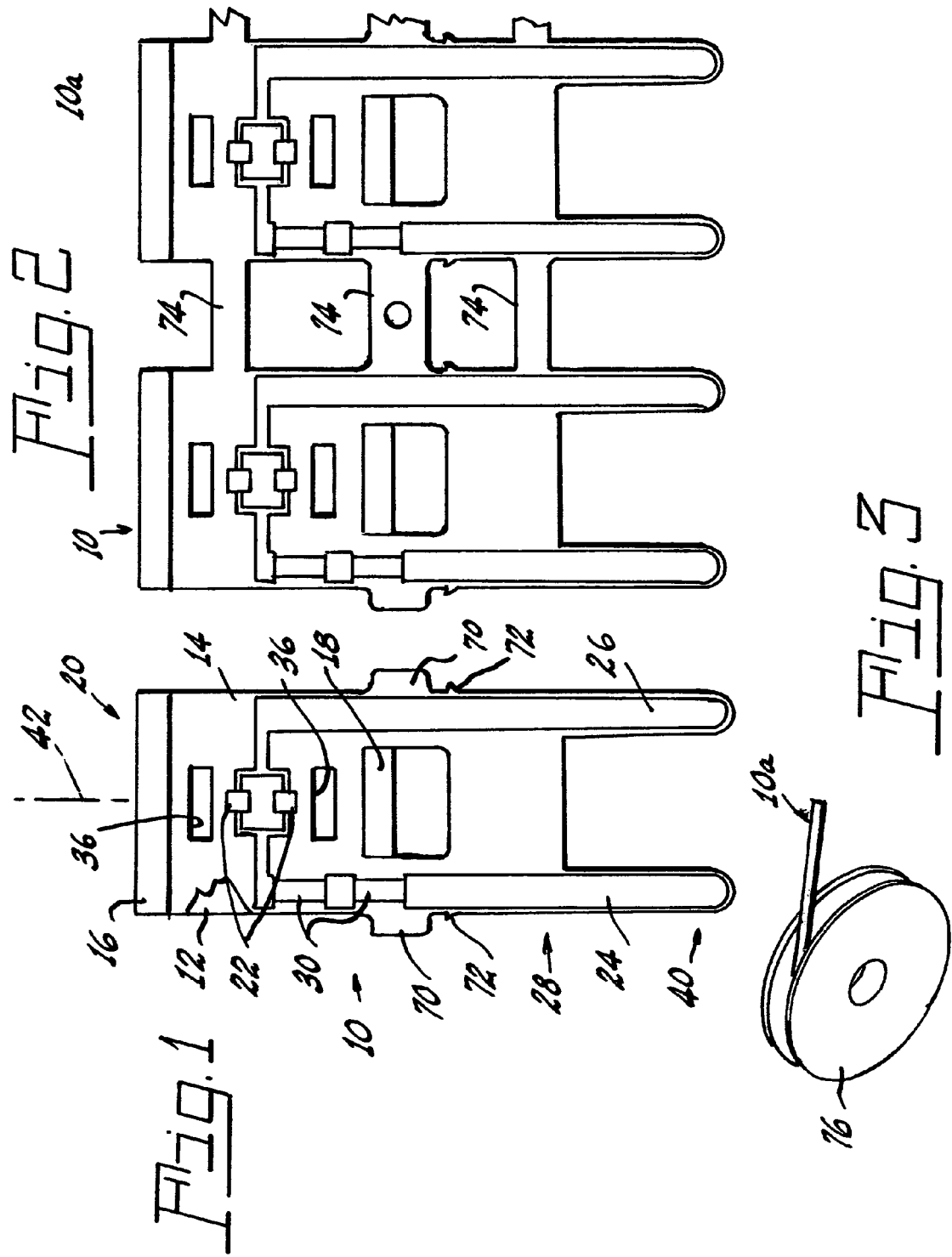

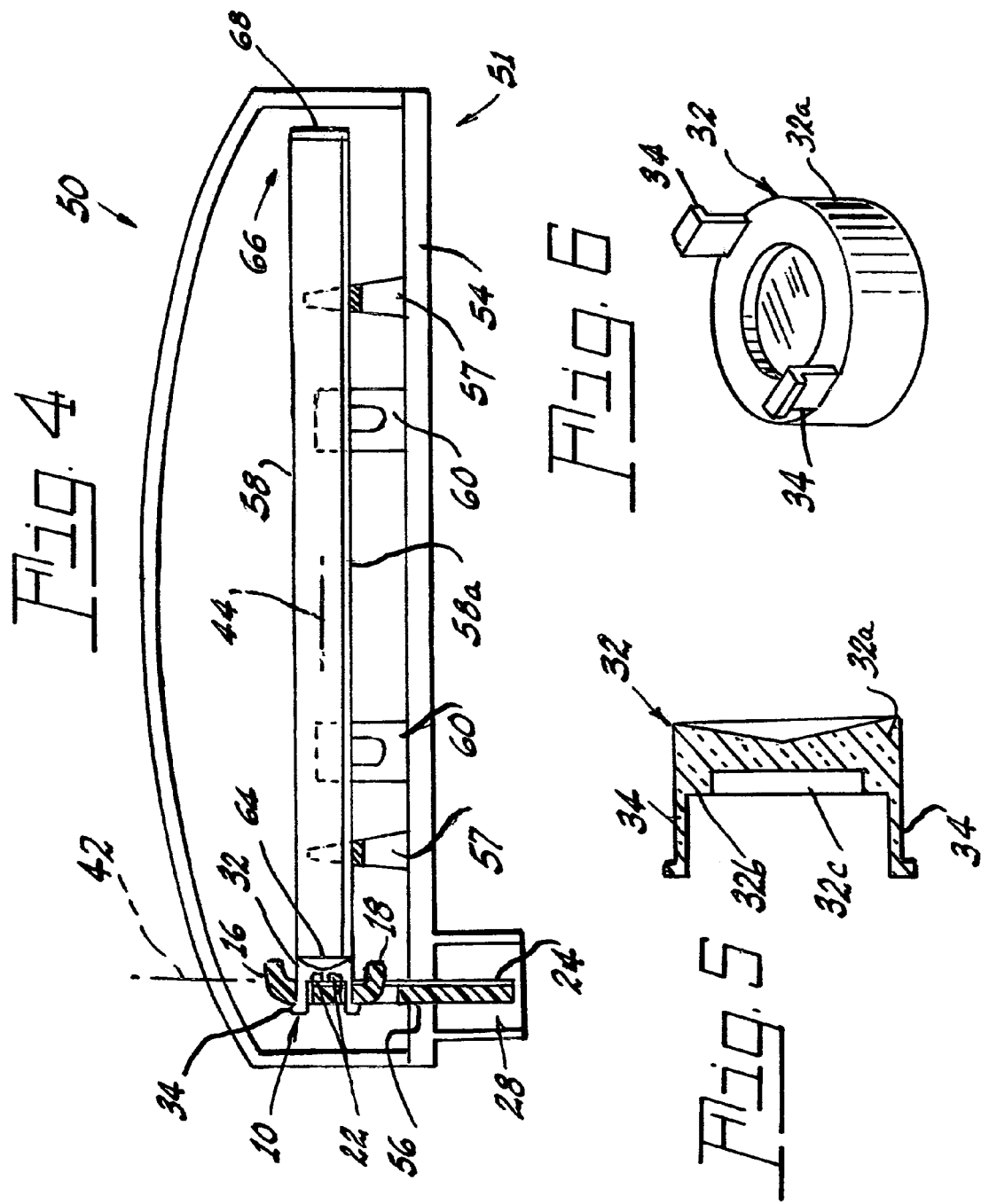

LED LIGHT SOURCE WITH INTEGRATED CIRCUIT AND LIGHT GUIDE

TECHNICAL FIELD

This invention relates to light sources and more particularly to elongated light sources. Still more particularly it relates to light sources employing light emitting diodes (LED or LEDs) for elongated light sources that can be used as the center high mount stop light (CHMSL) for automotive vehicles.

BACKGROUND ART

The now ubiquitous CHMSL has utilized many varieties of light sources including incandescent, neon and LEDs. Because of their relatively long life and cool operating temperatures (when compared to incandescent light sources) LEDs have taken over the majority of these applications. However, their cost and complexity of manufacture have caused some concern in the industries using them. For example, most of the LED sources available for CHMSL use require a large printed circuit board and a large number of LEDs, each one usually associated with an individual lens. It is not uncommon for many brands of automobile to use six or more LEDs in this manner and, during operation, these LEDs show as a plurality of pinpoints of light.

DISCLOSURE OF INVENTION

It is, therefore, an object of this invention to obviate the disadvantages of the prior art.

It is another object of the invention to simplify light sources.

Yet another object of the invention is the enhancement of light sources generally and elongated light sources in particular.

These objects are accomplished, in one aspect of the invention, by the provision of a light engine comprising: a thermally conductive substrate having a dielectric on one side thereof; upper and lower lens guards positioned near one end of the substrate; at least one LED mounted on the dielectric between the lens guards; and electrical conductors mounted upon the dielectric at another end thereof for supplying power to the LED. An elongated light source according to another aspect of the invention comprises: a subassembly including a base, a light engine positioned in mounting means formed in the base; a light guide positioned in spaced apart supports for receiving and distributing light from the LED, and a cover fixed to the base. This elongated light source provides an even, well distributed illumination and avoids the pinpoint of light display of the prior art. Also, it uses fewer LEDs and as a consequence, employs simpler circuitry, this combination resulting in a lower cost.

BRIEF DESCRIPTION OF THE DRAWINGS

FIG. 1 is an elevational view of a light engine according to an aspect of the invention;

FIG. 2 is an elevational view of a string of light engines;

FIG. 3 is an elevational view of a string of light engines wound on a spool for ease of manufacture;

FIG. 4 is an elevational, sectional view of a light source in accordance with an aspect of the invention.

FIG. 5 is an enlarged sectional view of a lens that can be used with the invention; and FIG. 6 is a perspective of the rear surface of the lens of FIG. 5.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Referring now to the drawings with greater particularity, there is shown in FIG. 1 a light engine 10 comprising: a thermally conductive substrate 12 fabricated of a suitable material, such as aluminum, having a thermally conductive dielectric 14, such as ceramic-filled silicone, on one side thereof. Employing the thermally conductive material for the substrate 12 allows the substrate to function both as the supporting element and a heat sink. The use of a heat sink is important because, even though the heat generated by operation of the LEDs is less than that that would be supplied by incandescent bulbs, it can be sufficient to damage the LEDs when they are driven at high power.

Upper and lower lens guards, 16, 18, respectively, are positioned near one end 20 of the substrate 12 and preferably are formed directly from the substrate material, for example, by bending over the top edge of the substrate 12 to form the upper lens guard 16 and by punching and bending the lower lens guard 18 from the center portion of the substrate 12.

At least one LED 22 is mounted on the substrate between the lens guards 16, 18. As shown in the figures, two LEDs 22 are preferred, and they can be mounted upon the substrate via a thermal adhesive set directly on the dielectric 14, thus providing the direct connection to the heat sink. Electrical conductors 24, 26 are mounted upon the substrate at another end 28 thereof for supplying power to said LED. The electrical conductors 24, 26 can be conductive traces, applied by the techniques used in the manufacture of printed circuit boards.

If desired, or necessary because of requirements of the circuitry involved, electrical components 30, such as resistor, capacitors, etc., can be operatively associated with at least one of the electrical conductors.

A lens 32 is positioned over the LED 22s and comprises a lens body 32a having mounting clips 34 formed to engage retaining slots 36 formed in the substrate 12. The rear surface 32b of the lens body 32a contains a pocket 32c for receiving the LEDs 22, as shown in FIG. 4.

The substrate 12 extends along a first axis 42 and LEDs 22 emit light along a second axis 44, that is substantially normal to the first axis 42, as shown in FIG. 4.

The light engine 10 is a part of an elongated light source 50 that comprises a subassembly 51 having a base 54 that includes means 56 in the form of a slot for receiving the light engine 10, spaced apart supports 57 for mounting a light guide 58, and a plurality of cover retainers 60. The base 54 is generally rectangular and is preferably constructed from an ABS material. The supports 57 are generally U-shaped to receive the cylindrical light guide 58 within the bight, and the legs of the U-shaped supports preferably extend beyond the centerline of the light guide to provide a friction-fit and maintain the light guide in its desired position. The supports 57 are aligned along the centerline of the base 54, while the cover retainers, 60 are positioned about the edge of the base 54.

The light guide 58 comprises a transparent, acrylic rod having a first end 64 in light-receiving contact with the lens 32 and a second end 66 having a reflective coating 68 thereon. Alternatively, a second light engine could be placed at the second end in place of the reflective coating. A portion of the bottom 58a of the light guide 58 is glossy white in color to act as a diffuse reflector and preferably is co-extruded with the transparent portion.

In a preferred embodiment the substrate 12 is provided with lateral extensions 70 that can be used as the insertion handles for positioning the light engine 10 in the receiving means 56 and a retention barb 72 is provided adjacent the lateral extensions 70 for maintaining the light engine 10 in its desired location.

A prime advantage of this form of light engine 10 is the availability for achieving automation of the product. This can be accomplished by providing a string 10a (see FIG. 2) of light engines 10 connected by separable bridges 74 that can be wound on a reel 76, such as shown in FIG. 3, for subsequent removal.

The use of a small number of LEDs reduces the cost of the light source and the use of simple light engine enables many automation techniques not heretofore available.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. A light engine comprising:
   a thermally conductive substrate lying in a first plane and having a dielectric on one side thereof;
   upper and lower lens guards extending in a second plane normal to said first plane positioned near one end of said substrate;
   at least one LED mounted on said dielectric between said lens guards;
   a pair of lateral extensions formed with said substrate and projecting therefrom in said first plane;
   a pair of retention barbs associated with said pair of lateral extensions and extending in said first plane; and
   electrical conductors mounted upon said dielectric at another end thereof for supplying power to said at least one LED.

2. The light engine of claim 1 wherein electrical components are operatively associated with at least one of said electrical conductors.

3. The light engine of claim 1 wherein a lens is positioned over said at least one LED.

4. The light engine of claim 3 wherein said lens is provided with mounting clips and said mounting clips engage slots formed in said substrate.

5. The light engine of claim 1 wherein a first of said lens guards is formed at said one end of said substrate and a second of said lens guards is formed intermediate said one end and a second end.

6. The light engine of claim 1 wherein said substrate extends along a first axis and said at least one LED emits light along a second axis substantially normal to said first axis.

7. An elongated CHMSL light source for an automotive vehicle comprising:
   a subassembly including a base;
   mounting means in the shape of a slot formed in said base;
   a light engine including at least one LED positioned in said slot, said light engine including retention barbs that engaging sides of said slot;
   a plurality of U-shaped supports positioned on said base; and
   an elongated cylindrical light guide positioned in said plurality of U-shaped supports in a manner to receive light emitted from said at least one LED, and a cover fixed to said base.

8. The elongated CHMSL light source of claim 7 wherein said light engine comprises
   a thermally conductive substrate lying in a first plane and having a dielectric on one side thereof;
   upper and lower lens guards extending in a second plane normal to said first plane positioned near one end of said substrate;
   a pair of retaining slots formed in said substrate intermediate said upper and lower lens guards;
   a lens mounted over said at least one LED, said lens including mounting clips engaging said pair of retaining slots;
   a pair of lateral extensions formed with said substrate and projecting therefrom in said first plane; and
   electrical conductors mounted upon said dielectric at another end thereof for supplying power to said at least one LED.

9. The elongated CHMSL light source of claim 8 wherein said light guide comprises a transparent rod having a first end in light-receiving contact with said lens and a second end having a reflective coating thereon.

* * * * *